US010008962B1

(12) United States Patent
Khizroev et al.

(10) Patent No.: US 10,008,962 B1
(45) Date of Patent: Jun. 26, 2018

(54) INSTANTLY RECHARGEABLE BATTERY DEVICE

(71) Applicants: Sakhrat Khizroev, Miami, FL (US); Rakesh Guduru, Miami, FL (US)

(72) Inventors: Sakhrat Khizroev, Miami, FL (US); Rakesh Guduru, Miami, FL (US)

(73) Assignee: The Florida International University Board of Trustees, Miami, FL (US)

( * ) Notice: Subject to any disclaimer, the term of this patent is extended or adjusted under 35 U.S.C. 154(b) by 0 days. days.

(21) Appl. No.: 15/692,423

(22) Filed: Aug. 31, 2017

(51) Int. Cl.
*H02N 2/18* (2006.01)
*H01L 41/20* (2006.01)
*H01L 41/06* (2006.01)
*H01L 41/12* (2006.01)

(52) U.S. Cl.
CPC ............. *H02N 2/186* (2013.01); *H01L 41/06* (2013.01); *H01L 41/125* (2013.01); *H01L 41/20* (2013.01)

(58) Field of Classification Search
CPC .......... H01L 41/06; H01L 41/20; H02N 2/186
See application file for complete search history.

(56) References Cited

U.S. PATENT DOCUMENTS 7,804,229 B2 * 9/2010 Tucker .................. H01M 10/46
310/26
8,330,334 B2 * 12/2012 Lee ......................... H01L 41/00
310/26

* cited by examiner

*Primary Examiner* — J. San Martin
(74) *Attorney, Agent, or Firm* — Saliwanchik, Lloyd & Eisenschenk

(57) ABSTRACT

A compact magnetic-based battery device that offers energy, a large number of cycles, a long storage time, and a short charging time is provided. The rechargeable battery device can include a first magnetic layer, a second magnetic layer, a dielectric layer disposed between the first magnetic layer and the second magnetic layer, and a plurality of high anisotropic magnetic nanoparticles embedded into the dielectric layer.

12 Claims, 4 Drawing Sheets

INSTANTLY RECHARGEABLE BATTERY DEVICE

STATEMENT OF GOVERNMENT SUPPORT

This invention was made with government support under Grant No. ECCS-0939514 awarded by National Science Foundation. The government has certain rights in the invention.

BACKGROUND

Increased reliance on technology-based solutions, as well as the expanding field of the internet of things, has necessitated growth in the area of rechargeable batteries. Battery markets have significantly grown in recent decades, and advancements in computing, portable and wearable-sensor applications, and electric vehicles will only boost demand for rechargeable batteries.

One of the most essential stumbling blocks, which limits modern applications of rechargeable batteries, is their relatively slow recharging time. Important industries of interest that can benefit from improved batteries include e-vehicles, portable computers, cells phones, mobile devices, and other electronic device industries that use rechargeable batteries.

BRIEF SUMMARY

Embodiments of the subject invention aim to replace the current chemistry-based batteries, which traditionally exhibit a relatively slow recharging process, with a magnetics-based battery of a comparable energy density and with an instantaneous recharging process. Embodiments of the subject invention provide new and novel magnetic-based batteries that provide a high energy capacity, a small size, a large number of cycles, a long storage time, and a short charging time. Experimental analysis has shown that magnetics-based batteries can be effectively fabricated and optimized to provide batteries that can store energy and can recharge very quickly (e.g., instantaneously recharge).

Embodiments of the subject invention also provide methods for fabrication of a rechargeable battery device. Magnetic nanoparticles can be embedded into one or more dielectric layers. Nanoparticle sizes and shapes can be modified to accommodate cost and application-based considerations.

DETAILED DESCRIPTION

Embodiments of the subject invention relate to the rapidly growing area of rechargeable batteries. Battery markets have significantly grown in recent decades, and market trends indicate continued growth. Besides the endless computing, portable, and wearable-sensor applications, new applications have been developed in the rapidly growing electric vehicle and solar power industries. One of the most essential stumbling blocks that limits modern applications of rechargeable batteries is their relatively slow recharging time. Recharging time can be decreased by replacing current chemistry-based batteries, which are constrained by a relatively slow recharging process, with magnetics-based batteries of a comparable energy density and with an extremely fast (e.g., instantaneous) recharging process.

A list of desired battery characteristics includes a high energy capacity, a small size, a large number of cycles, a long storage time, and a short charging time. In the current chemistry-based batteries, the latter characteristic (charging time) is limited by the relatively slow underlying chemistry accompanied with ion transport. During the recharging process, an external current source supplies charge, the charge is then redistributed in the battery through chemical reactions. As a result, such a chemistry-driven recharging process is relatively slow. For example, even with high-power current sources, it takes at least tens of minutes to charge electric vehicles.

Embodiments of the subject invention provide new and novel devices, which use strongly coupled magnetic and dielectric regions or layers to store and recharge magnetic energy. The magnetic energy density generated is comparable to that of traditional chemical-based batteries. However, by leveraging the properties of magnetic and dielectric materials the recharging process is instantaneous. The energy is stored in the non-volatile magnetic regions or layers and thus as opposed to relying on complex and slow chemical reactions, the magnetic regions or layers can be demagnetized during the discharge process. The regions can be magnetized during the recharging process via instantaneous application of a magnetic field, whose strength can overcome the coercivity field of the magnetic regions or layers.

Figure 1A:
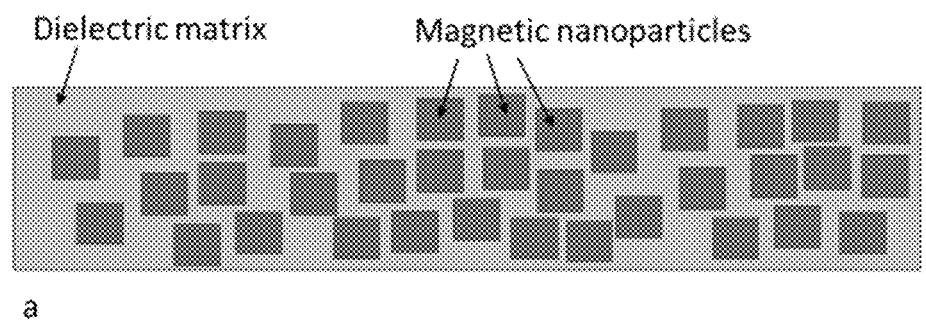
FIG. 1(a) shows a diagram of a magnetic battery with magnetic nanoparticles incorporated in a piezoelectric dielectric matrix configuration, according to an embodiment of the subject invention.
Figure 1B:
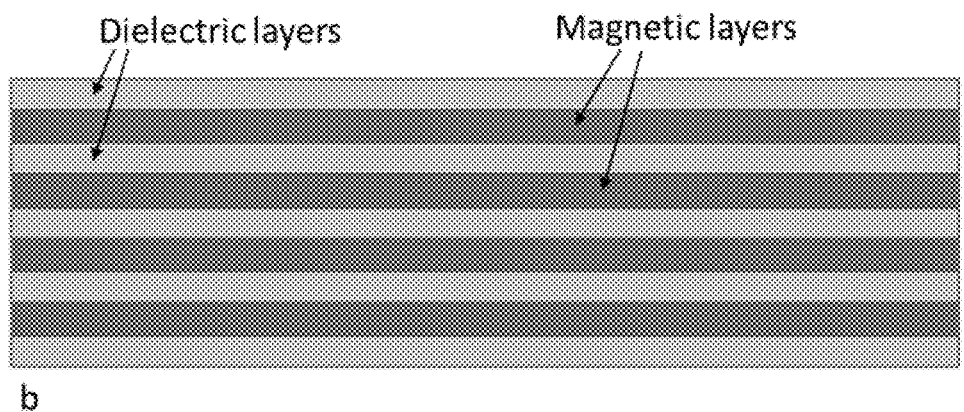
FIG. 1(b) shows a diagram of a magnetic battery incorporating a stack of alternating magnetic and piezoelectric dielectric layers, according to an embodiment of the subject invention.

A guiding principle that underlies embodiments of the subject invention is the use of high-efficiency magnetoelectric (ME) materials, in which the magnetic and electric fields are relatively strongly coupled. Conventionally, the coupling between the two fields is defined by the ME coefficient, α. According to the Landau expression, to the second degree approximation, the cross-term energy of such a multiferroic system, W, can be expressed as $$W = \alpha H \cdot E \quad (1)$$

where H and E are the magnetic and electric fields, respectively. There are several types of ME materials defined by the nature of the ME coupling. In multiferroic composites, a magnetostrictive magnetic component and a piezoelectric dielectric component can be tightly coupled at their interface to induce a non-zero magneto-electric (ME) effect in the range of 1 to over 100 mV cm$^{-1}$Oe$^{-1}$, depending on the materials compositions and the magnitude of lattice structure matching at the interface. In this case, due to the ME effect, the energy of the battery can be stored in the non-volatile magnetic regions, while the interface of the magnetic regions with the surrounding dielectric regions is used to convert the magnetic energy into the electric voltages and currents used during battery charging and discharging. The magnetic regions can be in different forms, such as isolated nanoscale magnetic regions surrounded by the dielectric material or thin magnetic layers separated by thin dielectric layers, as shown in FIGS. 1(a) and 1(b), respectively. In the latter case, the voltage is developed across the layers.

Figure 2:
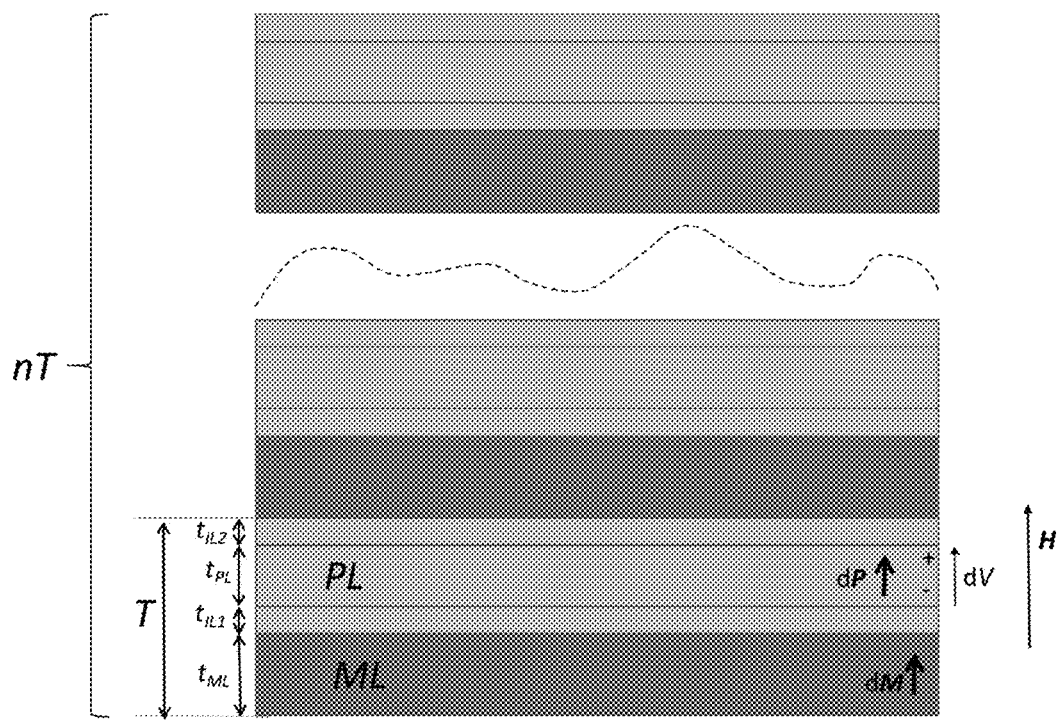
FIG. 2 shows a diagram of a magnetic battery with stacked magnetic and piezoelectric layers, according to an embodiment of the subject invention.

For example, in a certain embodiment, a multilayered stack of n alternating magnetostrictive layers (MLs) and piezoelectric layers (PLs) could be used, as illustrated in FIG. 2. Optionally, in each periodic set, adjacent ML and PL can be separated by an additional interface layer (IL) to optimize crystal lattice matching between the two materials. Application of an external magnetic field H induces a magnetic moment dM in the ML which in turn, due to the presence of a non-zero ME effect at the interface of the ML and PL, induces a change of the voltage dV across the PL. According to the above Landau formulation, the resulting change of the electric dipole moment, dP, can be presented according to the following expression:

$$dP = \alpha k H \quad (2)$$

where $\alpha$ is the effective ME coefficient of the stack, and k is a number between 0 and 1 that characterizes the effective magnetic field in the dielectric layer due to the magnetization in the magnetic layer. In this illustration, the external magnetic field is applied normal to the plane. In this case, it can be assumed that the magnetic layers have a perpendicular anisotropy (due to the intrinsic magnetocrystalline perpendicular anisotropy). In other embodiments, materials can possess in-plane or even tilted magnetization orientations.

The induced voltage over the entire stack as a result of the field application to magnetize the magnetic layers can be expressed as follows:

$$V \sim \alpha n t_{PL} H \quad (3)$$

In some embodiments of the subject invention, magnetic and dielectric layers can have an equivalent thickness of 5 nm or approximately 5 nm, $t_{PL} = t_{ML} = 5$ nm, an interlayer thickness, $t_{IL}$, of less than 1 nm, a number of layers, n, can be 100, a net thickness that can be on the order of 1000 nm, and a net dielectric thickness that can be on the order of 500 nm. The effective magnetic field strength, H, in the stack in a saturated state can be equivalent to the saturation magnetization, $M_S$, which can be 10,000 oersteds (Oe) or about 10,000 Oe and k~1. The magnetoelectric coefficient, $\alpha$, can be 100 mV cm$^{-1}$Oe$^{-1}$. According to Equation 3, this configuration would result in a voltage drop across a 1000-nm stack in the saturated state of 50 mV (V~100 mVcm$^{-1}$ Oe$^{-1}$·100·5×10$^{-7}$ cm·10,000 Oe~50 mV). Therefore, a millimeter-thick stack can produce voltage on the order of tens of volts across the stack, for an embodiment in which the magnetic layers are magnetized in the same perpendicular orientation. A stack with a coercivity of approximately 1000 Oe, would require an external magnetic field strength that can overcome this coercivity in order to magnetize the stack or in other words to instantaneously recharge the battery. A battery as described above can remain charged and leakage-free for at least 10 years.

Figure 3:
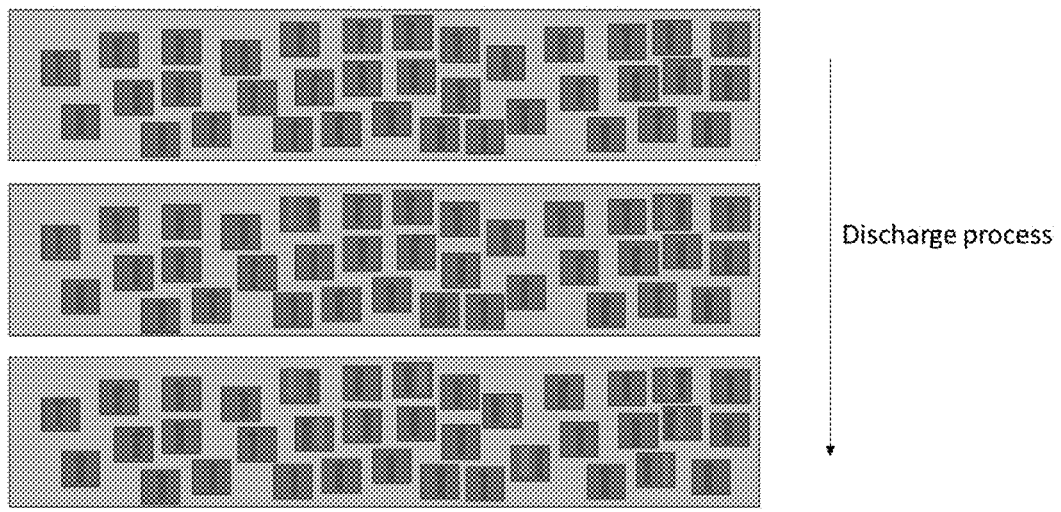
FIG. 3 shows an illustrative diagram of a demagnetization process.

In some embodiments, the magnetic part of the battery can gradually become demagnetized during the discharge process, through spin reversing in magnetic regions, as illustrated in FIG. 3. Alternatively, the energy can be changed via spin dis-alignment. The arrows pointing up and down represent spin "up" and "down" orientations in magnetic regions, respectively. The process of demagnetization can take place at the nanoscale due to the interfacial nature of the ME effect. As an electric current flowing through the discharge circuit, parts in one or more nanoscale or microscale domains can change their relative spin orientations and eventually transition into lower energy states. Throughout the discharge process, single-domain nanoparticles gradually transition into multi-domain states, as shown in the example illustrated in FIG. 3. According to this basic example, in the initial fully magnetized state, all the nanoparticles can be assumed to be in a saturated single-domain state. When nanoparticles get demagnetized, they can transition into a multi-domain magnetic state. Thus, the energy stored is the magnetic energy of the magnetized spins. Here, it should be understood that this picture is oversimplified. For example, this representation doesn't take into account a significant amount of energy stored in magnetic materials through a quantum-mechanical exchange coupling between adjacent spins. As a result of the discharge, this energy can also be affected and thus can contribute a substantial additional amount of energy. However, to simplify the illustration of the magnetic charge/discharge/storage, the trivial case of the magnetostatic dipole-dipole energy expressed as the classical demagnetization process will be focused on.

In a saturated state, each magnetic nanoparticle can have a demagnetization energy of $E_s = -\mu_0/2 M_s H_d$, where $M_s$ and $H_d$ are the saturation magnetization and the demagnetization field, respectively. Assuming the nanoparticles are perfect spheres, the demagnetization field can be $H_d = -1/3 M_s$. Then, $E_s = -\mu_0/2 M_s H_d = 1/6 \mu_0 M_s^2$. For $M_s \sim 1000$ emu/cc, $E_s \sim 1$ MJ/m$^3$, which implies an energy density of 0.001 MJ/L. Again, taking into account the contribution from the exchange energy would further significantly increase this energy density.

Figure 4:
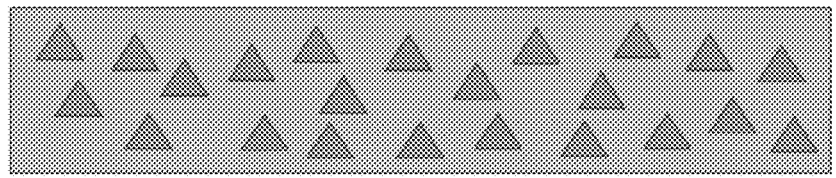
FIG. 4 shows a diagram of a magnetic battery incorporating anisotropic magnetic nanoparticles incorporated into a piezoelectric layer, according to an embodiment of the subject invention.

In some embodiments, even the dipole-dipole energy can be further increased though anisotropic shape configuration of the nanostructures, as shown in FIG. 4. By configuring pyramid-shape nanostructures, the magnetic field energy in each nanostructure can be effectively increased by two orders of magnitude. For such a shape-dominant nanostructure to be magnetically stable and remain in a quasi-single-domain state, it is imperative to use a high anisotropy material, with a coercivity field of 1 Tesla (T) or higher. Then, the magnetic energy density of such nanoparticles can be as high as 0.1 MJ/L or higher, which is comparable to the energy stored in traditional state-of-the-art batteries.

Figure 5:
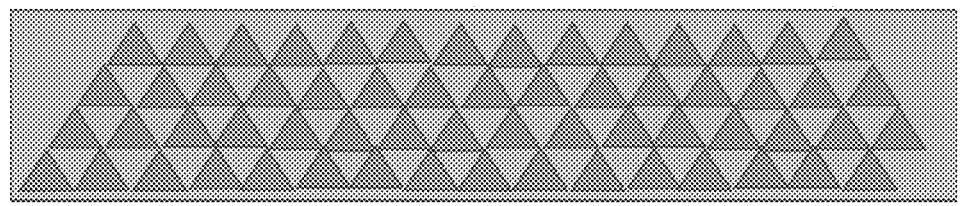
FIG. 5 shows a diagram of a magnetic battery with periodically patterned magnetic nanoparticles in a piezoelectric layer, according to an embodiment of the subject invention.

In yet other embodiments, the energy stored in the magnetic battery can be further increased by (i) using materials exhibiting high magnetocrystalline anisotropy and high magnetic moment and/or (ii) optimizing the relative configurations of the magnetic and piezoelectric components. In one embodiment, the magnetic nanostructures can be placed in a periodic pattern to exploit collective periodic effects, as shown in FIG. 5. Besides other advantages, the periodic configuration can be expected to further increase the coupling between magnetic and piezoelectric components.

Multiple methods and techniques can be employed to fabricate such devices, i.e., magnetic nanoparticles integrated into a piezoelectric matrix. Materials for fabrication can comprise the following properties: (1) magnetic materials with a high saturation magnetization (to increase the storage energy density); (2) magnetic nanostructures with a geometric shape that maximizes the stored magnetic energy; (3) high ratio of the magnetic to dielectric material to increase the effective energy storage (nanoparticles can be spatially close, however distances closer than approximately 2-3 nm can result in essential quantum-mechanical exchange coupling); (4) strong coupling between magnetic and dielectric material at the interface, for example, selecting materials with adequate crystal lattice matching, to maximize the effective ME coefficient; and/or (5) magnetic materials with a high anisotropy energy density, (e.g., magnetocrystalline or shape-defined), to minimize energy leakage effects that occurs over time and to optimize energy storage time.

As an example, a battery could comprise high-anisotropy magnetic nanoparticles made of $CoFe_2O_4$ integrated into a dielectric layer, such as a piezoelectric matrix made of $BaTiO_3$. These two materials are known to show certain lattice matching to provide a relatively high ME coefficient.

In certain embodiments of the subject invention, a magnetic battery can be fabricated as follows: a first step can be to fabricate the $CoFe_2O_4$ nanoparticles. Optionally, the size of the nanoparticles can be varied in a range up to 10 nm using co-precipitation, and greater than 10 nm using a crystallization technique, such as a hydrothermal method. Nanoparticles (e.g., nanoparticles having a size in a range of from 2-10 nm) can be synthesized via co-precipitation of $Co^{2+}$ and $Fe^{3+}$, or $Fe^{2+}$ with NaOH. A 50 ml aqueous solution of cobalt (II) hexahydrate (0.108 mol/L) and 50 ml of iron (II) chloride (0.201 mol/L) is heated to a desired temperature of 40° C. (for 2 nm), 60° C. (for 4 nm), or 80° C. (for 10 nm). 20 ml of the aqueous NaOH (3.5 mol/L) can then be added rapidly to the solution. The solution is constantly stirred at 500 rpm. After 30 minutes, an acid (for example, 0.84 g of oleic acid) can be added drop-wise. In certain embodiments, a preferred pH value after co-precipitation is 13. The solution can continue to be stirred for an additional 2 hrs, and allowed to cool naturally. After the solution has cooled, the solution pH can be adjusted to 4-5. The pH of the solution can be reduced by adding an acid (for example, nitric acid). The nanoparticles can be repeatedly washed to remove excess materials.

Nanoparticles with a size of greater than 10 nm can be synthesized via a hydrothermal method. 0.058 g of $Co(NO_3)_2.6H_2O$ and 0.16 g of $Fe(NO_3)_3.9H_2O$ can be dissolved in 15 ml of distilled water and 0.2 g of polyvinylpyrrolidone can be dissolved in 5 ml of aqueous solution containing 0.9 g of sodium borohydride at 120° C. for 12 hours.

After the nanoparticles are fabricated, a second step can be to prepare a $BaTiO_3$ precursor solution. The precursor solution of $BaTiO_3$ can be prepared by mixing 30 ml of aqueous solution containing 0.029 g of $BaCO_3$ and 0.1 g of citric acid with 30 ml of ethanolic solution containing 1 g of citric acid and 0.048 ml of titanium (IV) isopropoxide.

A third step can be integration of $CoFe_2O_4$ nanoparticles into a $BaTiO_3$ matrix. $CoFe_2O_4$ nanoparticles (ranging from 0.1 g to over 1 g) can be mixed into a $BaTiO_3$ precursor solution and the mixture can be subjected to ultrasonic vibrations for 2 hrs. Once the $CoFe_2O_4$ nanoparticles are thoroughly dispersed, the mixture is dried on a hot plate at 70° C. overnight, while applying continuous stirring. The obtained polymer precursor can then be placed into a mold of a specific form (for example, the battery configuration of interest) and then subjected to temperature ranging from 400° C. to over 700° C., for a duration of time ranging from 1 hour to over 5 hours depending on the specific form of choice.

The subject invention includes, but is not limited to, the following exemplified embodiments.

Embodiment 1

A rechargeable battery device, the device comprising:
a magnetostrictive material layer (having a top surface and a bottom surface); and
a dielectric material layer magnetically and electrically connected to the magnetostrictive material layer (and having a top surface and a bottom surface).

Embodiment 2

A rechargeable battery device, the device comprising:
a plurality of magnetostrictive material layers (each having a top surface and a bottom surface); and
a plurality of dielectric material layers magnetically and electrically connected to the plurality of magnetostrictive material layers (and each having a top surface and a bottom surface).

Embodiment 3

The device according to embodiment 2, in which the bottom surface of each magnetostrictive material layer of the plurality of magnetostrictive material layers is disposed above the top surface of at least one dielectric layer of the plurality of dielectric layers (e.g., disposed above the top surface of each dielectric layer of the plurality of dielectric layers).

Embodiment 4

The device according to embodiment 2, in which the bottom surface of each dielectric layer of the plurality of dielectric layers is disposed above the top surface of at least one magnetostrictive material layer of the plurality of magnetostrictive material layers (e.g., disposed above the top surface of each magnetostrictive material layer of the plurality of magnetostrictive material layers).

Embodiment 5

The device according to any of embodiments 1-4, in which at least one dielectric layer is directly connected to at least one magnetostrictive material layer (e.g., each dielectric layer is directly connected to at least one magnetostrictive material layer).

Embodiment 6

The device according to any of the embodiments 1-5, in which an interface layer is disposed between at least one magnetostrictive material layer and at least one dielectric layer.

Embodiment 7

The device according to any of embodiments 1-6, in which at least one magnetostrictive material layer has a thickness equal to a thickness of at least one dielectric layer.

Embodiment 8

The device according to any of embodiments 1-7, in which at least one magnetostrictive layer is configured to have a perpendicular magnetic anisotropy.

Embodiment 9

The device according to any of embodiments 1-8, in which at least one magnetostrictive layer is configured to have an in-plane magnetic anisotropy.

Embodiment 10

The device according to any of embodiments 1-9, in which at least one magnetostrictive layer is configured to have a tilted magnetic anisotropy.

Embodiment 11

The device according to any of embodiments 1-10, in which a ratio of the thickness of a dielectric layer to the thickness of an interface layer is 5:1.

Embodiment 12

The device according to any of embodiments 1-11, in which the top surface of a first magnetostrictive layer is directly connected to the bottom surface of a first dielectric layer, the top surface of a dielectric layer (e.g., the first dielectric layer or a second dielectric layer) is connected to the bottom surface of a second magnetostrictive layer, and a plurality of magnetic nanoparticles are embedded into at least one dielectric layer (e.g., the first dielectric layer, the second dielectric layer, or both).

Embodiment 13

The device according to embodiment 12, in which the plurality of magnetic nanoparticles include cobalt ferrite, CoFe2O4.

Embodiment 14

The device according to any of embodiments 1-13, in which each dielectric layer includes magnesium oxide (MgO).

Embodiment 15

A rechargeable battery device, the device comprising:
a dielectric layer; and
a plurality of magnetic nanoparticles magnetically and electrically connected to and embedded in the dielectric layer.

Embodiment 16

The device according to embodiment 15, in which each magnetic nanoparticle of the plurality of magnetic nanoparticles has an anisotropic field measuring 1 Tesla (T) or greater.

Embodiment 17

The device according to any of embodiments 15-16, in which the plurality of magnetic nanoparticles are configured in a periodic pattern.

Embodiment 18

The device according to any of embodiments 15-17, in which the size of each magnetic nanoparticle of the plurality of magnetic nanoparticles is in a range of from 2 nm to 10 nm.

Embodiment 19

The device according to any of embodiments 15-17, in which the size of each magnetic nanoparticle of the plurality of magnetic nanoparticles is greater than 10 nm.

Embodiment 20

The device according to any of embodiments 15-19, in which each magnetic nanoparticle of the plurality of magnetic nanoparticles has a pyramid-like shape.

Embodiment 21

The device according to any of embodiments 15-20, in which the dielectric layer includes $BaTiO_3$.

Embodiment 22

The device according to any of embodiments 15-18 and 20-21, in which the nanoparticles can be (or are) synthesized via co-precipitation of $Co^{2+}$ and $Fe^{3+}$, or via co-precipitation of $Fe^{2+}$ with NaOH.

A greater understanding of the present invention and of its many advantages may be had from the following examples, given by way of illustration. The following examples are illustrative of some of the methods, applications, embodiments and variants of the present invention. They are, of course, not to be considered as limiting the invention. Numerous changes and modifications can be made with respect to the invention.

Example 1

Figure 6A:
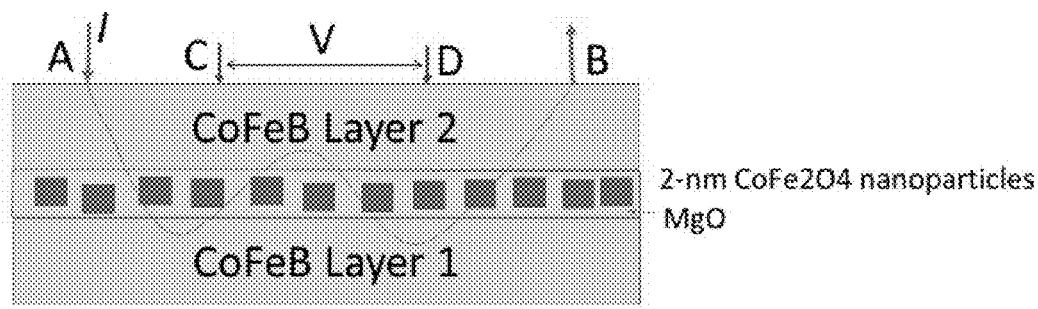
FIG. 6(a) shows a cross-sectional view of a magnetic battery according to an embodiment of the subject invention.
Figure 6B:
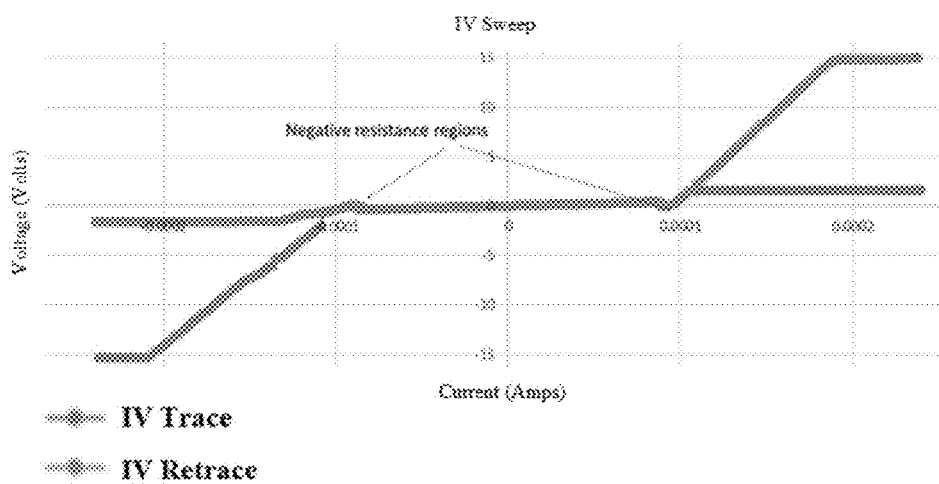
FIG. 6(b) shows I-V characteristics of the battery of FIG. 6(a).

In order to demonstrate the operation of the instantly rechargeable device, the following described prototype was fabricated. High-anisotropy 2-nm CoFe2O4 magnetic nanoparticles were "embedded" into a thin (~4 nm) dielectric layer of MgO (by being "sandwiched between two 1-nm MgO layers) and then sandwiched between two thin (~2 nm) CoFeB magnetic layers, as illustrated in FIG. 6a. In more detail, to "embed" 2-nm nanoparticles into the 4-nm MgO layer, a 2-nm MgO layer was first deposited through sputter deposition. Then, MgO was deposited through a spraying technique, and then another 2-nm MgO layer was deposited on top of the nanoparticles. The I-V curve was measured via a 4-point contact technique assuming the electron free-path length is greater than the total thickness of the junction. In this case, electrons scatter through the entire stack. The two electric current contact points are shown in FIG. 6(a) as A and B, respectively, while the two voltage contact points are shown as C and D, respectively. The measured I-V characteristic, as seen in FIG. 6(b), clearly indicates negative resistance regions indicating strong battery performance.

It should be understood that the examples and embodiments described herein are for illustrative purposes only and that various modifications or changes in light thereof will be suggested to persons skilled in the art and are to be included within the spirit and purview of this application.

All patents, patent applications, provisional applications, and publications referred to or cited herein (including those in the "References" section, if present) are incorporated by reference in their entirety, including all figures and tables, to the extent they are not inconsistent with the explicit teachings of this specification.

What is claimed is:

1. A rechargeable battery device, the device comprising:
   at least one magnetostrictive material layer having a top surface and a bottom surface; and
   at least one dielectric layer magnetically and electrically connected to the at least one magnetostrictive material layer and having a top surface and a bottom surface,
   the at least one magnetostrictive material layer comprising a first magnetostrictive material layer and a second magnetostrictive material layer,
   the at least one dielectric layer comprising a first dielectric layer,
   the device further comprising a plurality of magnetic nanoparticles embedded into the first dielectric layer,
   the top surface of the first magnetostrictive material layer being directly connected to the bottom surface of the first dielectric layer, and
   the top surface of the first dielectric layer being connected to the bottom surface of the second magnetostrictive material layer.

2. The device according to claim 1, further comprising an interface layer disposed between the at least one magnetostrictive material layer and the at least one dielectric layer.

3. The device according to claim 1, each magnetostrictive material layer having a thickness equal to a thickness of each dielectric layer.

4. The device according to claim 1, each magnetostrictive material layer being configured to have a perpendicular magnetic anisotropy.

5. The device according to claim 1, each magnetostrictive material layer being configured to have an in-plane magnetic anisotropy.

6. The device according to claim 1, each magnetostrictive material layer being configured to have a tilted magnetic anisotropy.

7. The device according to claim 2, a ratio of a thickness of the at least one dielectric layer to a thickness of the interface layer being 5:1.

8. The device according to claim 1, the plurality of nanoparticles comprising cobalt ferrite ($CoFe_2O_4$).

9. The device according to claim 1, the first dielectric layer comprising magnesium oxide (MgO).

10. A rechargeable battery device, the device comprising:
    at least one magnetostrictive material layer having a top surface and a bottom surface;
    at least one dielectric layer magnetically and electrically connected to the at least one magnetostrictive material layer and having a top surface and a bottom surface; and
    an interface layer disposed between the at least one magnetostrictive material layer and the at least one dielectric layer,
    the at least one dielectric layer being directly connected to the at least one magnetostrictive material layer,
    each magnetostrictive material layer having a thickness equal to a thickness of each dielectric layer,
    each magnetostrictive material layer being configured to have a perpendicular magnetic anisotropy, an in-plane magnetic anisotropy, or a tilted magnetic anisotropy,
    a ratio of a thickness of the at least one dielectric layer to a thickness of the interface layer being 5:1,
    the at least one magnetostrictive material layer comprising a first magnetostrictive material layer and a second magnetostrictive material layer,
    the at least one dielectric layer comprising a first dielectric layer,
    the device further comprising a plurality of magnetic nanoparticles embedded into the first dielectric layer,
    the top surface of the first magnetostrictive material layer being directly connected to the bottom surface of the first dielectric layer, and
    the top surface of the first dielectric layer being connected to the bottom surface of the second magnetostrictive material layer.

11. The device according to claim 10, the plurality of nanoparticles comprising cobalt ferrite ($CoFe_2O_4$).

12. The device according to claim 11, the first dielectric layer comprising magnesium oxide (MgO).

* * * * *